United States Patent
Isokawa et al.

(10) Patent No.: US 7,128,444 B2
(45) Date of Patent: Oct. 31, 2006

(54) LIGHT EMITTING DIODE LAMP

(75) Inventors: Shinji Isokawa, Kyoto (JP); Tomoji Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 120 days.

(21) Appl. No.: 10/506,002

(22) PCT Filed: Feb. 24, 2003

(86) PCT No.: PCT/JP03/01995

§ 371 (c)(1),
(2), (4) Date: Aug. 27, 2004

(87) PCT Pub. No.: WO03/073520

PCT Pub. Date: Sep. 4, 2003

(65) Prior Publication Data

US 2005/0116246 A1 Jun. 2, 2005

(30) Foreign Application Priority Data

| Feb. 28, 2002 | (JP) | ............................. 2002-054624 |
| Feb. 28, 2002 | (JP) | ............................. 2002-054625 |
| Apr. 9, 2002  | (JP) | ............................. 2002-106312 |

(51) Int. Cl.
*F21V 3/00* (2006.01)

(52) U.S. Cl. .................... 362/311; 362/800; 362/296

(58) Field of Classification Search ................ 362/296, 362/800; 257/98, 100, 102, 103; 313/512
See application file for complete search history.

(56) References Cited

U.S. PATENT DOCUMENTS 6,586,874 B1 * 7/2003 Komoto et al. ............. 313/503

FOREIGN PATENT DOCUMENTS

| JP | 62-44530     | 3/1987  |
| JP | 62-162860 U  | 10/1987 |
| JP | 1-152676     | 6/1989  |
| JP | 5-63242      | 3/1993  |
| JP | 11-26811     | 1/1999  |
| JP | 11-112024    | 4/1999  |
| JP | 2001-94158   | 4/2001  |
| JP | 2001-352100  | 12/2001 |

* cited by examiner

*Primary Examiner*—Ali Alavi
(74) *Attorney, Agent, or Firm*—Hamre, Schumann, Mueller & Larson, P.C.

(57) ABSTRACT

A light emitting diode lamp includes a lead terminal 2 formed with a cup 8 having a conical inner circumferential surface serving as a light reflective surface 8a, an LED chip 4 bonded to a bottom surface 8b of the cup with a die bonding material H, a molded portion 6 made of a transparent synthetic resin for packaging the cup of the lead terminal. The bottom surface 8b of the cup is formed with a recess 9 or a protrusion 19 to which the LED chip 4 is bonded with the die bonding material H, whereby the light conversion efficiency of the conical light reflective surface 8a is enhanced.

12 Claims, 12 Drawing Sheets

LIGHT EMITTING DIODE LAMP

BACKGROUND OF THE INVENTION

1. Field of the Invention

The present invention relates to a light emitting diode lamp including a light emitting element packaged with a molded portion made of a transparent synthetic resin.

2. Description of the Related Arts

JP-A 1-152676 and JP-U 62-44530, for example, disclose a light emitting diode lamp of the type described above. Such a light emitting diode lamp generally includes a pair of lead terminals one of which has a front end formed with a cup in the form of an inverted truncated cone. The cup has a conical inner circumferential surface which is made a light reflective surface and a bottom surface on which an LED chip is bonded. The LED chip is connected to the other terminal by wire bonding using a thin metal wire. These elements are packaged by a molded portion made of a transparent synthetic resin and having a lens portion.

Specifically, as shown in FIG. 24 which shows the principal portion as enlarged, such a prior art light emitting diode lamp includes an LED chip 104 including an active light emitting layer 104a interposed between a lower layer 104b and an upper layer 104c. The LED chip 104 is bonded, with a die bonding material H, to a flat bottom surface 108b of a cup 108 formed as a recess at a front end of one lead terminal 102. The inner circumferential surface of the cup 108 is made a conical light reflective surface 108a, so that the light emitted from the light emitting layer 104a of the LED chip 104 is reflected upward in the figure by the conical light reflective surface 108a of the cup 108.

As shown in FIG. 25, conventionally, in bonding the LED chip 104, an appropriate amount of thermally meltable die bonding material H (i.e., a material that melts when heated and hardens when cooled) such as solder paste or a thermally hardenable die bonding material (i.e., a material that hardens when heated) is applied to the bottom surface 108b of the cup. Then, after the LED chip 104 is placed on the applied die bonding material H, the die bonding material is melted by heating and then hardened (or hardened by heating when a thermally hardenable die bonding material H is used).

However, since the bottom surface 108b of the cup 108 is a flat surface which is perpendicular to an axis 108c of the cup 108, the distance of the LED chip 104 from the bottom surface 108b varies depending on the amount of the die bonding material H applied to the bottom surface 108b. In other words, the height of the LED chip 104 varies along the axis 108c of the conical reflective surface 108a of the cup 108 depending on the applied amount of the die bonding material H. Therefore, the accuracy in positioning the LED chip 104 at a predetermined height position along the axis of the conical light reflective surface 108a of the cup 108 is low, which leads to a deterioration of conversion of light by the cup 108.

Further, when a large amount of die bonding material H is applied, the LED chip 104 placed thereon may be bonded while being inclined relative to the axis 108c of the cup 108. Also in such a case, the conversion of light by the cup is deteriorated.

In some cases, the light emitting layer 104a of the LED chip 104 is provided closer to the bottom surface (P layer) of the LED chip 104. Generally, in this type of LED chip, the light emitting layer 104a is positioned at a height of about 5 μm above the bottom surface of the LED chip 104.

When the LED chip 104 in which the light emitting layer 104a is arranged close to the bottom surface of the LED chip is placed on the thermally meltable die bonding material H applied to the bottom surface 108b of the cup 108 and heating is performed, the molten die bonding material H, if the amount is large, rises from the bottom surface (lower layer 104b) onto the side surface or is bulged to reach the upper layer 104c over the light emitting layer 104a and then hardens in such a state (See FIG. 24). In such a case, short circuiting between the lower layer 104c and the upper layer 104c may occur to cause a failure. Further, since the thermally meltable or thermally hardenable die bonding material H pushed out from under the bottom surface of the LED chip 104 and bulged to a position higher than the light emitting layer 104a is hardened without contacting the outer side surface of the LED chip 104, the light emitted from the light emitting layer 104a is blocked by the bulged die bonding material H. In this way, since the peripheral surface of the light emitting layer 104a is in such a covered state with the die bonding material H, the light cannot reach the conical light reflective surface 108a of the cup 108, whereby the light emission efficiency is considerably deteriorated.

When the thermally meltable die bonding material H applied to the bottom surface 108b in the cup 108 is melted by heating, the die bonding material flows along the flat bottom surface 108b of the cup 108 to spread onto all sides. Therefore, the LED chip 104 on the molten die bonding material H moves horizontally along the bottom surface 108b to be away from the axis 108c due to the spreading of the die bonding material H to all sides. Thus, when the die bonding material H is hardened, the LED chip is fixed to such a deviated position.

In this way, in bonding the LED chip 104 to the bottom surface 108b of the cup 108 in the prior art structure, the LED chip 104 deviates horizontally relative to the axis 108c of the cup 108 due to the spreading of the thermally meltable die bonding material H to all sides upon heating. Thus, it is difficult to accurately position the center of the LED chip 104 on the axis 108c of the cup 108 or the nearby position, so that the conversion of light by the cup is deteriorated.

DISCLOSURE OF THE INVENTION

An object of the present invention is to solve the problems described above.

According to a first aspect of the present invention, there is provided a light emitting diode lamp comprising at least one lead terminal formed with a cup having a conical inner circumferential surface serving as a light reflective surface, an LED chip bonded to a bottom surface of the cup with a die bonding material, and a molded portion made of a transparent synthetic resin for packaging at least the cup of the lead terminal. The bottom surface of the cup in the lead terminal is formed with a recess of a size which does not receive the LED chip.

Since the bottom surface in the cup is formed with a recess of a size which cannot receive the LED chip, a thick portion of the bulged molten solder paste partially enters the recess. Therefore, the thickness of the molten solder on the bottom surface at portions where the recess does not exist can be made smaller than in the prior art technique, provided that the same amount of solder paste is applied. Therefore, the variation of the thickness of the molten solder depending on the applied amount of solder can be suppressed.

Therefore, as compared with the case where the recess is not provided, it is possible to reliably suppress the height variation of the LED chip in the axial direction of the cup due to the variation of the applied amount of solder paste, and the inclination of the LED chip relative to the axis of the cup. Therefore, it is possible to position the LED chip at a predetermined position along the axis of the conical reflective surface of the cup with high accuracy while suppressing the inclination of the LED chip, whereby the light conversion efficiency of the cup can be considerably enhanced.

Moreover, the bulging or rising of the die bonding material along the side surface of the LED chip can be suppressed. Therefore, even when the light emitting layer of the LED chip is located close to the bottom surface, short circuiting in the LED chip and the reduction of the light from the LED chip can be reliably prevented.

In the first aspect described above, to obtain the following effects, the die bonding material may be a thermally hardenable material, and the recess may have a configuration which is similar to the configuration of a bottom surface of the LED chip, as viewed axially of the cup.

With such an arrangement, the center of the LED chip can be positioned accurately at the center of the recess automatically due to the surface tension of the thermally meltable die bonding material in molten state. Thus, the position of the LED chip can be automatically corrected (self alignment) so that the LED chip can be located at the center of the recess or the nearby portion, and the LED chip in this state can be bonded to the bottom surface. Therefore, as viewed in the axial direction of the cup, the LED chip can be accurately arranged at a position on the axis of the cup or a nearby position, whereby the light conversion efficiency of the cup can be largely enhanced.

When the bottom surface of the LED chip is made rectangular and hence the recess has a rectangular configuration congruent to the bottom surface, the following advantage is provided in addition to the above-noted automatic correction (self alignment) to locate the LED chip at the center or the nearby portion of the recess. That is, the posture of the LED chip can be automatically corrected so that each of the side surfaces of the LED chip becomes parallel or generally parallel with a respective one of the side surfaces of the recess due to the surface tension of the thermally meltable die bonding material in molten state, and the LED chip in this state is bonded to the bottom surface. Therefore, it is possible to reliably suppress the variation of light emission, which occurs when each of the side surfaces of the LED chip is not in parallel with a respective one of the side surfaces of the recess.

Particularly, the automatic correction (self alignment) due to the thermally meltable die bonding material is more reliably achieved when the length and the width of the rectangle recess are no less than 0.5 times the length and the width of the rectangle LED chip.

According to a second aspect of the present invention, there is provided a light emitting diode lamp comprising at least one lead terminal formed with a cup having a conical inner circumferential surface serving as a light reflective surface, an LED chip bonded to a bottom surface of the cup with a die bonding material, and a molded portion made of a transparent synthetic resin for packaging at least the cup of the lead terminal. The bottom surface of the cup in the lead terminal is formed with a protrusion projecting like an island from the bottom surface, and the protrusion has a top surface to which the LED chip is bonded.

The die bonding of the LED chip to the top surface of the island-like protrusion formed on the bottom surface of the cup provides following advantages. When the LED chip placed on a thermally hardenable die bonding material or a thermally meltable die bonding material in a melted state is pushed toward the protrusion, an excess of the die bonding material flows from the top surface of the protrusion toward the bottom surface along the outer side surface of the protrusion. Therefore, unlike the prior art LED chip, the rising or bulging of the die bonding material along a side surface of the LED chip is prevented. Therefore, it is possible to reliably lessen short circuiting and prevent the light emitted from the LED chip from being blocked before reaching the conical light reflective surface of the cup and the resulting degradation of light emission efficiency.

Since an excess of the die bonding material pushed out from the top surface of the protrusion flows along the outer side surface of the protrusion toward the bottom side, it is possible to reliably suppress the height variation of the LED chip in the axial direction of the cup due to the variation of the applied amount of solder paste, and the inclination of the LED chip relative to the axis of the cup. Therefore, it is possible to position the LED chip at a predetermined position along the axis of the conical reflective surface of the cup with high accuracy while suppressing the inclination of the LED chip, whereby the light conversion efficiency of the cup can be considerably enhanced.

In the second aspect, the following structures may preferably be employed.

First, the top surface of the protrusion may be formed with a recess of a size which does not receive the LED chip.

With such an arrangement, a thick portion of the bulged molten solder paste partially enters the recess. Therefore, the thickness of the molten solder on the bottom surface at portions where the recess does not exist can be made smaller than in the prior art technique, provided that the same amount of solder paste is applied. Therefore, the variation of the thickness of the die bonding material at that portions depending on the applied amount of the die bonding material can be suppressed. Therefore, the LED chip can be fixed at a predetermined position along the axis of the conical light reflective surface of the cup with high accuracy, whereby the light conversion efficiency of the cup can be enhanced. Moreover, since the rising or bulging of the die bonding material along a side surface of the LED chip is suppressed, the resulting short circuiting in the LED chip or the reduction in the amount of light emitted from the LED chip can be reliably suppressed.

The protrusion may have an outer side surface inclined to flare toward a base portion of the protrusion.

With such an arrangement, the angle at the corner where the top surface and the outer side surface of the protrusion meet becomes an obtuse angle. Therefore, as compared with the case where the outer side surface is not inclined and a right angle is defined, accumulation of the die bonding material at the edges of the top surface due to the surface tension is less likely to occur. Therefore, an excess of the die bonding material applied to the top surface of the protrusion smoothly and readily flows from the top surface to the outer side surface of the protrusion when the die bonding material is melted or the LED chip is pressed, whereby the die bonding material on the top surface can have small and uniform thickness. Therefore, the LED chip placed thereon can be accurately fixed at a predetermined position along the axis without inclination, and blocking of light and short circuiting in the LED chip can be suppressed. Particularly, when the die bonding material is a thermally meltable material, the die bonding material flows from the top surface to the outer side surface without braking halfway while spreading uniformly radially outward (to all sides). Therefore, the self alignment, which will be described later, can be achieved more reliably.

The above noted effects can be further promoted by forming a recess at the top surface of the protrusion while inclining the outer side surface of the protrusion.

The bottom surface of the cup may be formed with an annular groove surrounding the protrusion, and the top surface of the protrusion may be generally flush with the bottom surface of the cup.

With such an arrangement, the light emitting layer of the LED chip can be provided at a relatively deep position surrounded by the conical light reflective surface of the cup. Therefore, the light emitted from the light emitting layer can be directed to a deeper position on the conical light reflective surface, whereby the light conversion efficiency can be enhanced.

The protrusion may comprise a block-like member formed separately from the lead terminal and fixed to the bottom surface of the cup. With such a structure, the protrusion may not be made of the same material as that of the lead terminal but may be made of any material that is suitable for obtaining the above noted effect, such as one having good adhesion to the die bonding material. Therefore, the strength of the die bonding can be enhanced while ensuring the above noted effect.

The outer side surface of the protrusion may be formed with a groove for guiding the die bonding material from the top surface of the protrusion toward the base portion. With such a structure, an excess of the die bonding material applied to the top surface of the protrusion can easily flow toward the outer side surface through the groove. Therefore, the same effect as that of the third case noted above can be obtained.

The bottom surface of the cup may be formed with an annular groove surrounding the base portion of the protrusion. With such a structure, even when an excessive amount of die bonding material is applied to the top surface, the excess of the die bonding material can be reliably accumulated in the annular groove. Therefore, the self alignment can be achieved, and short circuiting and the inclination of the LED chip placed on the top surface can be prevented.

The portion where the top surface of the protrusion and the outer side surface of the protrusion meet may be rounded. With such a structure, the excess of the die bonding material applied to the top surface of the protrusion can flow to the outer side surface more easily.

As the die bonding material, use may be made of a thermally meltable material.

With such a structure, when the thermally meltable die bonding material is melted, the molten die bonding material flowing to all sides does not spread beyond the area of the top surface of the protrusion. Therefore, as compared with the case where the protrusion is not provided, the LED chip placed on the die bonding material is more reliably prevented from moving horizontally to deviate with respect to the axis of the cup. Therefore, the LED chip can be fixedly arranged at a position on the axis or the nearby portion of the cup with high accuracy. Therefore, the light conversion efficiency of the cup is largely enhanced.

As the die bonding material, use may be made of a thermally meltable material, and the protrusion may have a configuration which is congruent or similar to a configuration of a bottom surface of the LED chip, as viewed axially of the cup.

With such a structure, due to the surface tension of the molten die bonding material, the LED chip can be automatically positioned (self alignment) so that the center of the LED chip corresponds to the center of the protrusion, and the LED chip in this state is bonded to the protrusion.

Therefore, as viewed in the axial direction of the cup, the LED chip can be fixed at a position on the axis of the cup or the nearby portion with high accuracy.

For instance, when the LED chip as viewed in the axial direction of the cup is rectangular, the posture of the LED chip can be automatically adjusted (self alignment) so that each of the side surfaces of the LED chip extends in parallel or generally parallel with a respective one of the side surfaces of the rectangular protrusion due to the surface tension of the molten die bonding material. Therefore, it is possible to suppress the variation of light emission, which is likely to be caused when each side of the LED chip does not extend in parallel with a respective side of the protrusion.

As the die bonding material, use maybe made of a thermally meltable material, and as viewed axially of the cup, the top surface of the protrusion may have a configuration which is congruent or similar to the configuration of a bottom surface of the LED chip and has an area which is slightly smaller or larger than an area of the bottom surface of the LED chip.

With such an arrangement, the automatic correction (self alignment) of the posture and the center position of the LED chip due to the surface tension of the melted die bonding material can be achieved more reliably.

As the die bonding material, use may be made of a thermally meltable material, and the outer side surface of the protrusion may be a rough surface such as a satin-finished surface. With such an arrangement, when an excess of the die bonding material applied to the top surface of the protrusion overflows onto the outer side surface, the die bonding material adheres to the rough peripheral surface provided by satin finishing, for example. When the solder paste H is heated thereafter, the solder melted on outer side surface exhibits pump priming effect to promote the flow of the solder melted on the top surface toward the base portion of the protrusion. Therefore, this arrangement can promote the achievement of the self alignment, the prevention of short circuiting, and the prevention of the inclination of the LED chip placed on the top surface.

Other objects, features and advantages of the present invention will become clearer from the description of the embodiments given below with reference to accompanying drawings.

DETAILED DESCRIPTION OF THE PREFERRED EMBODIMENTS

Figure 1:
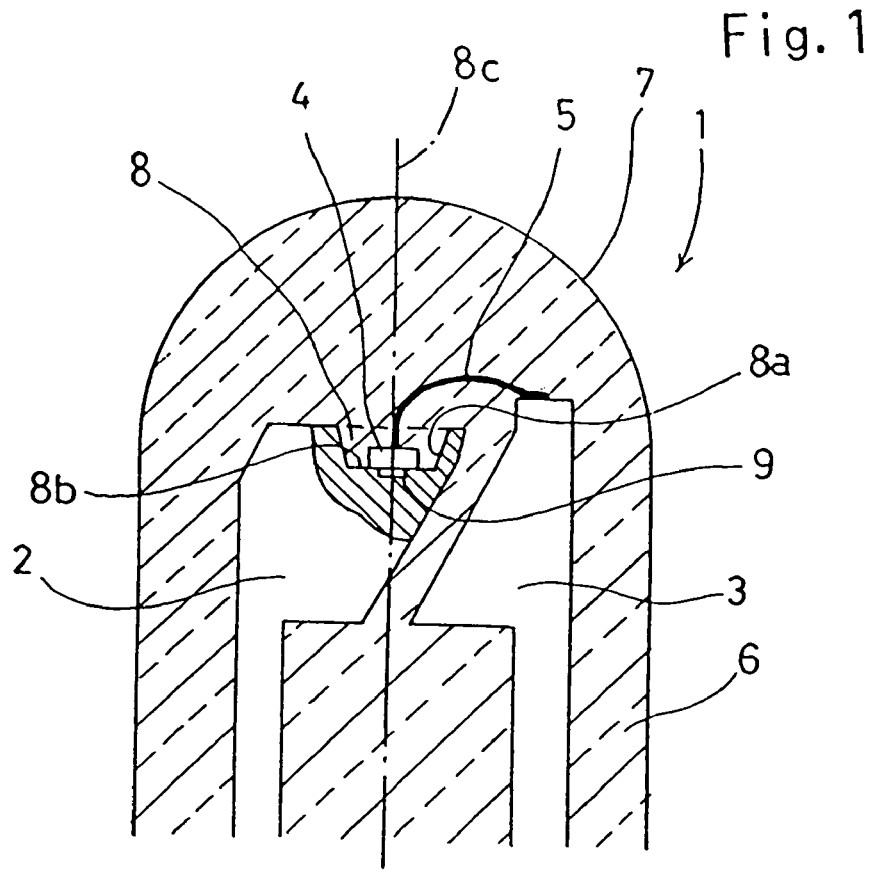
FIG. 1 is an enlarged longitudinal sectional view showing a principal portion of a light emitting diode lamp according to a first embodiment of the present invention.
Figure 2:
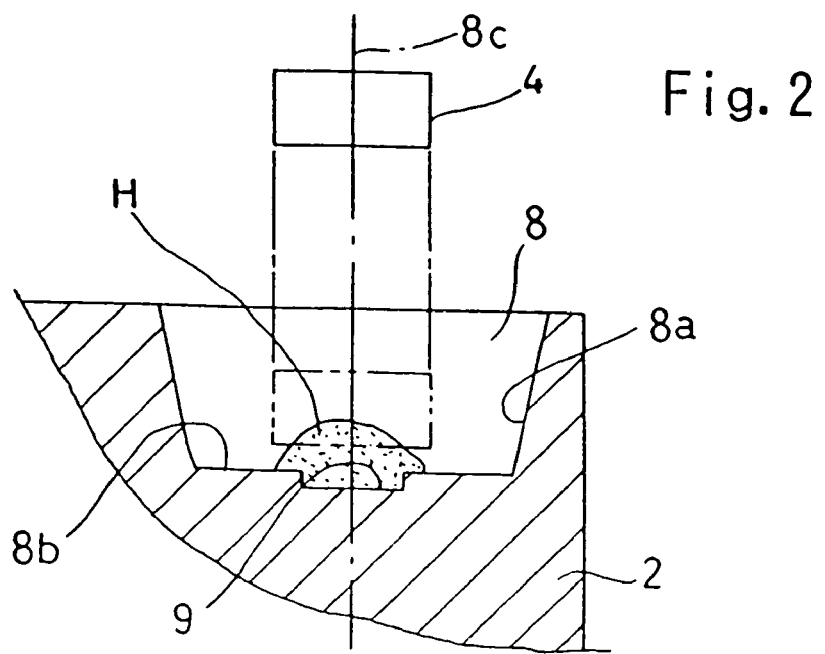
FIG. 2 is an enlarged longitudinal sectional view showing a front end of a lead terminal of the light emitting diode lamp according to the first embodiment.

FIGS. 1–5 show a first embodiment of the present invention.

Indicated by the reference sign 1 in these figures is a light emitting diode lamp. The light emitting diode lamp 1 comprises a pair of lead terminals 2 and 3, an LED chip 4 bonded to a front end of the lead terminal 2, a thin metal wire 5 bonded to the LED chip 4 and the lead terminal 3, and a molded portion 6 made of a transparent synthetic resin for packaging the front ends of the lead terminals 2 and 3. The molded portion 6 has an end integrally formed with a lens portion 7 focusing on the LED chip 4 or the nearby portion.

To bond the LED chip 4 to the front end of the lead terminal 2, a cup 8 in the form of a recess is formed at the front end of the lead terminal 2. The cup has conical inner circumferential surface formed as a light reflective surface 8a, and a bottom surface 8b formed with a recess 9 of a size which does not receive the LED chip 4.

Subsequently, an appropriate amount of solder paste H (obtained by mixing solder particles having a particle diameter of about 5–30 μm with a flux), which is an example of thermally meltable die bonding material, is applied to the recess 9. Then, after the LED chip 4 is placed on the solder paste H, the solder paste is heated to a temperature above the melting point and then cooled for hardening.

With such an arrangement, a thick portion of the bulged molten solder paste H partially enters the recess 9. Therefore, the thickness of the molten solder on the bottom surface 8b at portions where the recess 9 does not exist can be made smaller than in the prior art technique, provided that the same amount of solder paste H is applied. Therefore, the variation of the thickness of the molten solder depending on the applied amount of solder can be suppressed. Therefore, as compared with the case where the recess 9 is not provided, the height variation of the LED chip 4 in the direction of an axis 8c of the cup 8 as a result of the variation of the applied amount of solder paste H, i.e., the amount of molten solder can be reliably suppressed. Moreover, the LED chip 4 is reliably prevented from inclining relative to the axis 8c of the cup 8, and the molten solder is less likely to rise along a side surface of the LED chip 4.

Particularly, in this embodiment, the provision of the recess 9 at the bottom surface 8b of the cup 8 makes it possible to accurately position the LED chip 4 at the focal point of the lens portion 7 integrally formed at the front end of the molded portion 6 made of a transparent synthetic resin.

Figure 3:
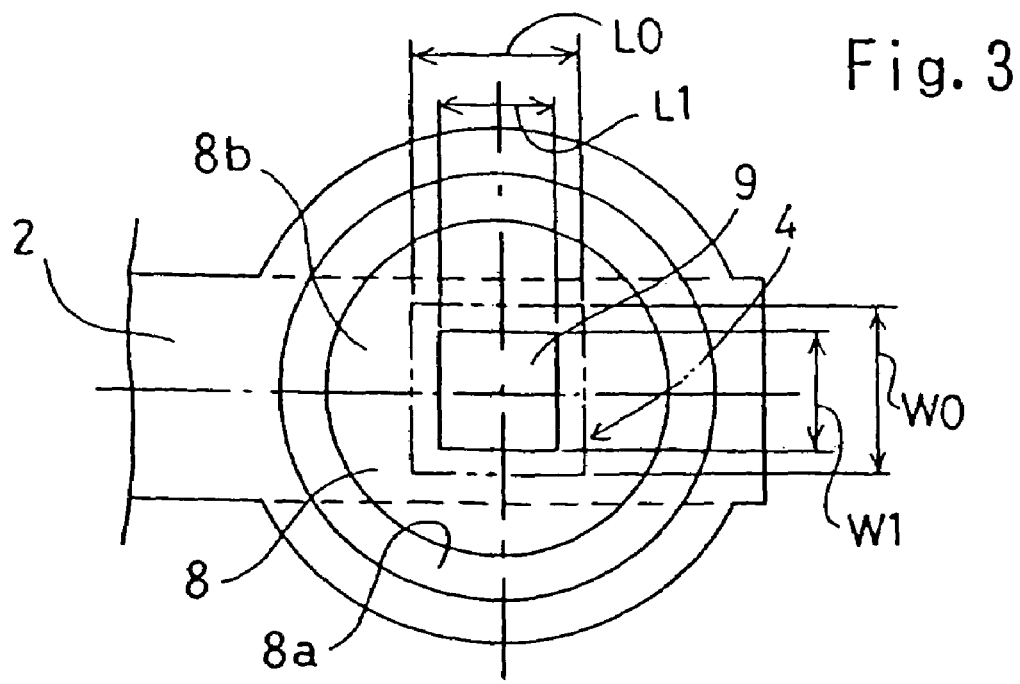
FIG. 3 is a plan view of FIG. 2.
Figure 4:
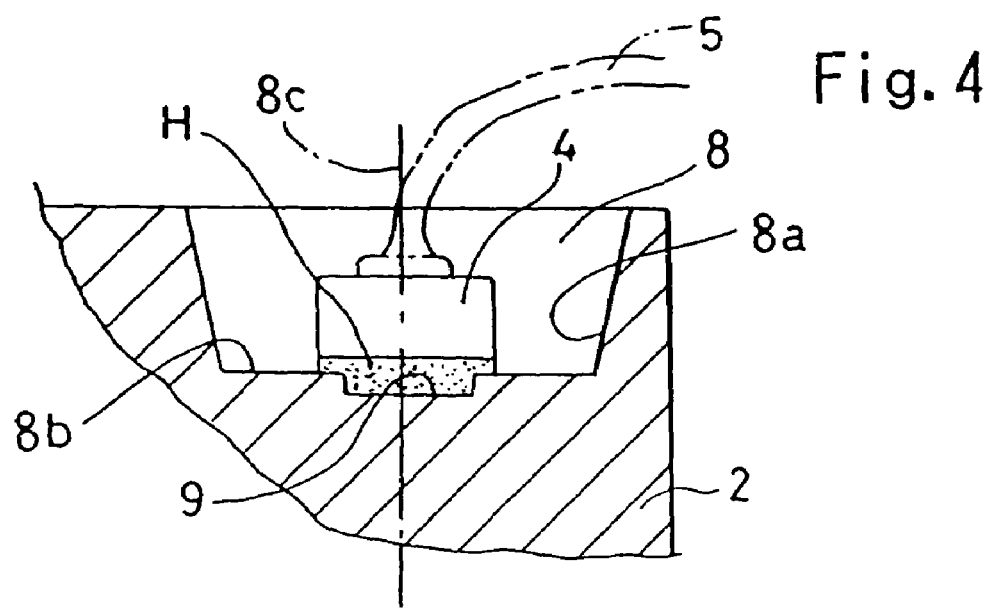
FIG. 4 is an enlarged longitudinal sectional view showing an LED chip bonded to the cup at the front end of the lead terminal.

As shown in FIG. 3 which illustrates the lamp as viewed in the direction of the axis 8c of the cup 8, when the LED chip is in the form of a rectangle having a length L0 and a width W0, the recess 9 at the bottom surface 8b for bonding the LED chip 4 may be in the form of a similar rectangle having a length L1 and a width W1.

Figure 5:
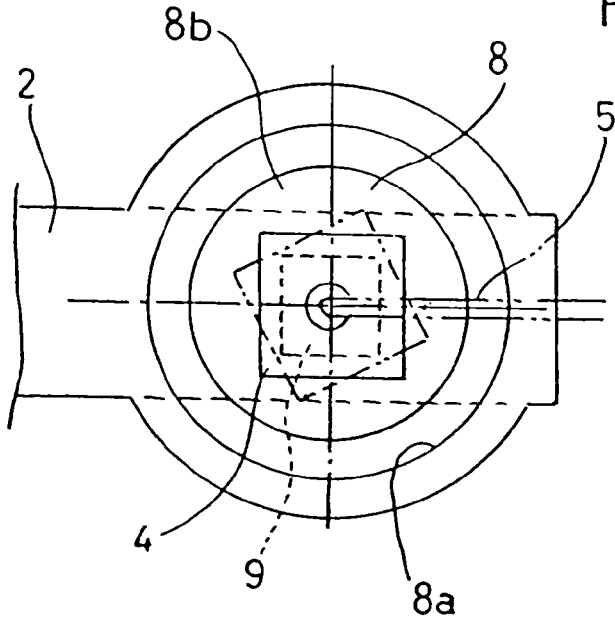
FIG. 5 is a plan view of FIG. 4.
Figure 6:
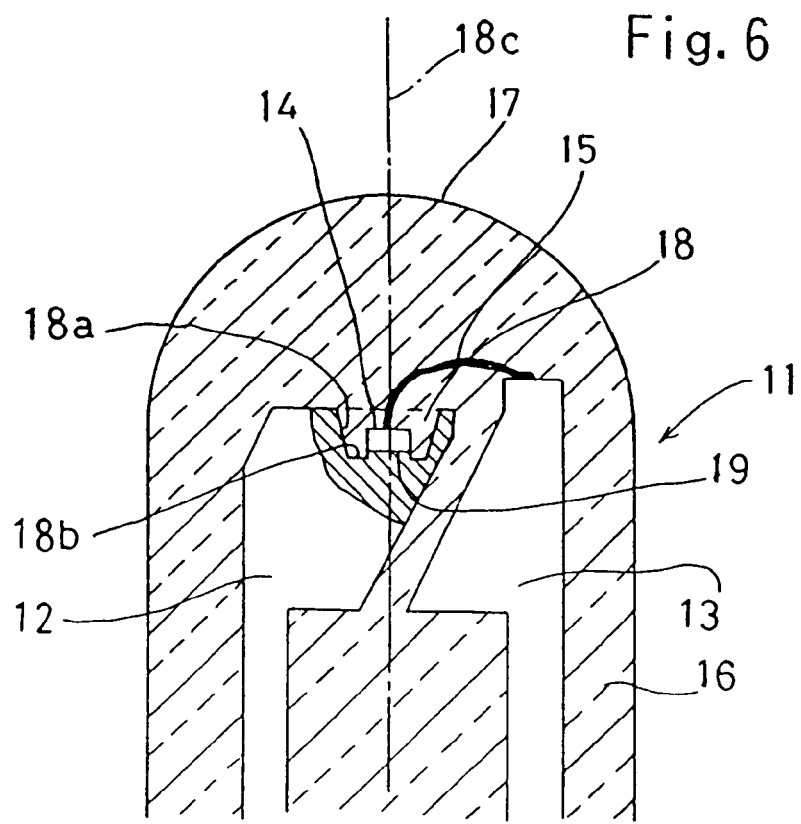
FIG. 6 is an enlarged longitudinal sectional view showing a principal portion of a light emitting diode lamp according to a second embodiment of the present invention.
Figure 7:
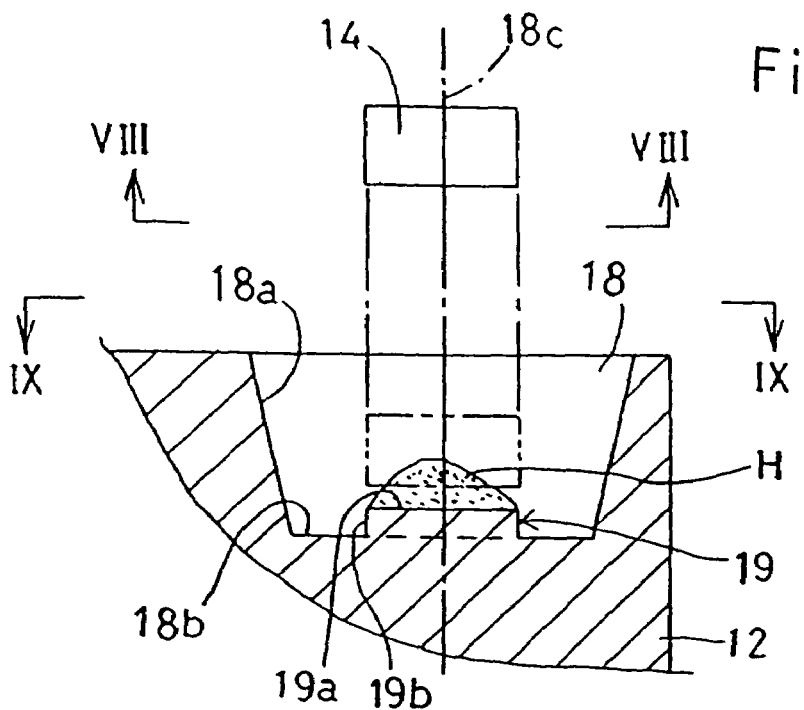
FIG. 7 is an enlarged longitudinal sectional view showing a front end of a lead terminal of the light emitting diode lamp according to the second embodiment.

As indicated by double-dashed lines in FIG. 5 which illustrates the lamp as viewed in the direction of the axis 8c of the cup 8, when the rectangular LED chip 4 is placed on the solder paste applied to the rectangular recess 9, the sides of the LED chip 4 may not be in parallel with the sides of the recess 9 or the center of the LED chip 4 may be offset from the center of the recess 9. Even in such a case, with the above arrangement, the surface tension of the molten solder acts simultaneously between each side of the LED chip 4 and a respective side of the recess 9. As a result, as indicated by solid lines in FIG. 5, the posture of the LED chip 4 is automatically corrected (self alignment) so that each side of the LED chip 4 become parallel or generally parallel with a respective side of the recess 9, and the position of the LED chip 4 is automatically corrected (self alignment) so that the center of the LED chip 4 corresponds to the center of the protrusion 9.

Through the experiment by the inventors, it has been found that the automatic correction (self alignment) due to the surface tension of the molten solder is reliably achieved when the length L1 and the width W1 of the rectangle of the recess 9 are no less than 0.5 times the length L0 and the width W0 of the rectangle of the LED chip 4 and is most reliably achieved when no less than 0.75 times.

FIGS. 6–22 show a second embodiment of the present invention.

Indicated by the reference sign 11 in these figures is a light emitting diode lamp. The light emitting diode lamp 11 comprises a pair of lead terminals 12 and 13, an LED chip 14 bonded to a front end of the lead terminal 12, a thin metal wire 15 bonded to the LED chip 14 and the lead terminal 13, and a molded portion 16 made of a transparent synthetic resin for packaging the front ends of the lead terminals 12 and 13. The molded portion 16 has a front end integrally formed with a lens portion 17 focusing on the LED chip 14 or the nearby portion.

To bond the LED chip 14 to the front end of the lead terminal 12, a cup 18 in the form of a recess is formed at the front end of the lead terminal 12. The cup has a conical inner circumferential surface formed as a light reflective surface 18a, and a bottom surface 18b integrally formed with a protrusion 19 projecting, like an island, from the bottom surface 18b. An appropriate amount of solder paste H is applied to a top surface 19a of the protrusion 19. Then, after the LED chip 14 is placed on the solder paste H, the solder paste is heated to a temperature above the melting point and then cooled for hardening.

With such an arrangement, since the island-like protrusion 19 is provided at the bottom surface 18b of the cup 18 with the LED chip 14 bonded to the top surface 19a of the protrusion by using the solder paste H as a thermally meltable die bonding material, the molten solder paste H does not spread beyond the area of the top surface of the protrusion 19. Therefore, as compared with the case where the protrusion 19 is not provided, the LED chip 14 placed on the molten solder is more reliably prevented from moving horizontally to deviate with respect to the axis 18c of the cup 18.

Therefore, the LED chip 14 can be fixedly positioned at the center or the nearby portion of the cup 18 with high accuracy. As viewed in the direction of the axis 18c of the cup 18, the protrusion 19 need not necessarily be rectangular similarly to the LED chip 14 but may be circular.

Figure 10:
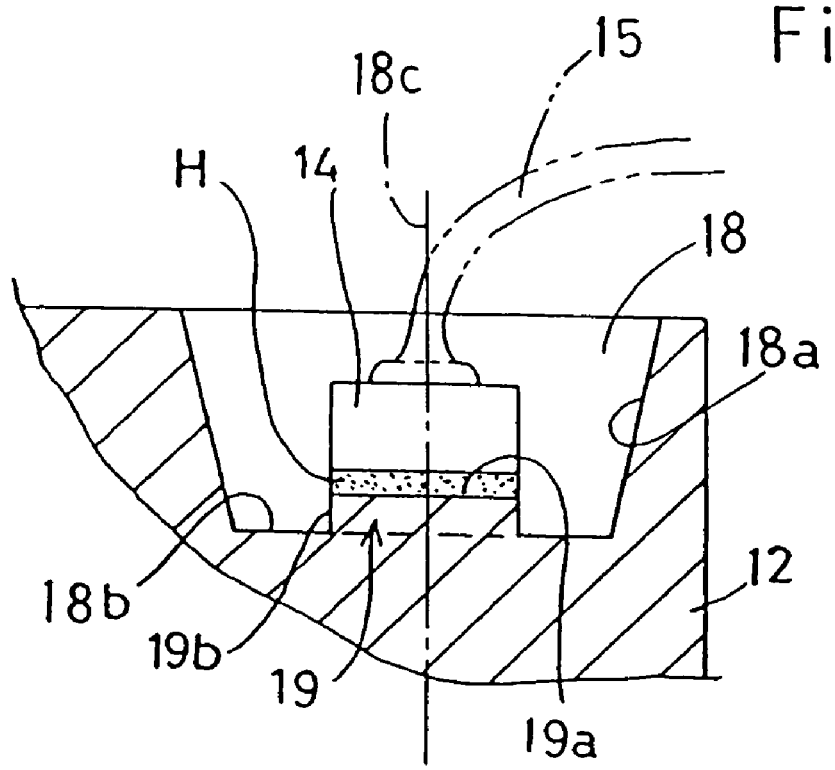
FIG. 10 is an enlarged longitudinal sectional view showing an LED chip bonded to the cup at the front end of the lead terminal.

Particularly, in the second embodiment, since the lens portion 17 is integrally formed at the front end of the molded portion 16 made of a transparent synthetic resin, the provision of the protrusion 19 makes it possible to accurately position the LED chip 14 on the optical axis passing through the focal point of the lens portion 17 or the nearby portion (See FIG. 10).

Figure 8:
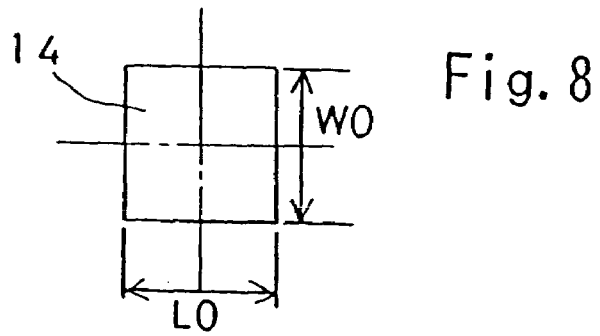
FIG. 8 is a bottom view as viewed along lines VIII—VIII in FIG. 7.
Figure 9:
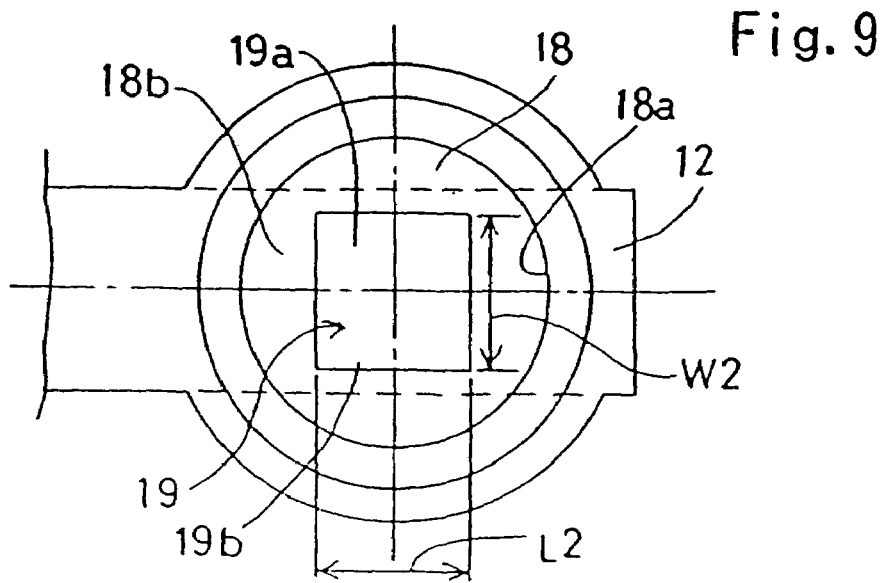
FIG. 9 is a plan view as viewed along lines IX—IX in FIG. 7.

As shown in FIG. 8, when the LED chip is in the form of a rectangle having a length L0 and a width W0, the protrusion 19 for bonding the LED chip 14 may be in the form of a rectangle having a length L2 and a width W2, as shown in FIG. 9. The protrusion may be congruent to the LED chip with the length L2 and the width W2 being equal to the length L0 and the width W0, respectively, or may be similar to the LED chip with the LED chip with the length L2 and the width W2 being approximate to the length L0 and the width W0, respectively.

Figure 11:
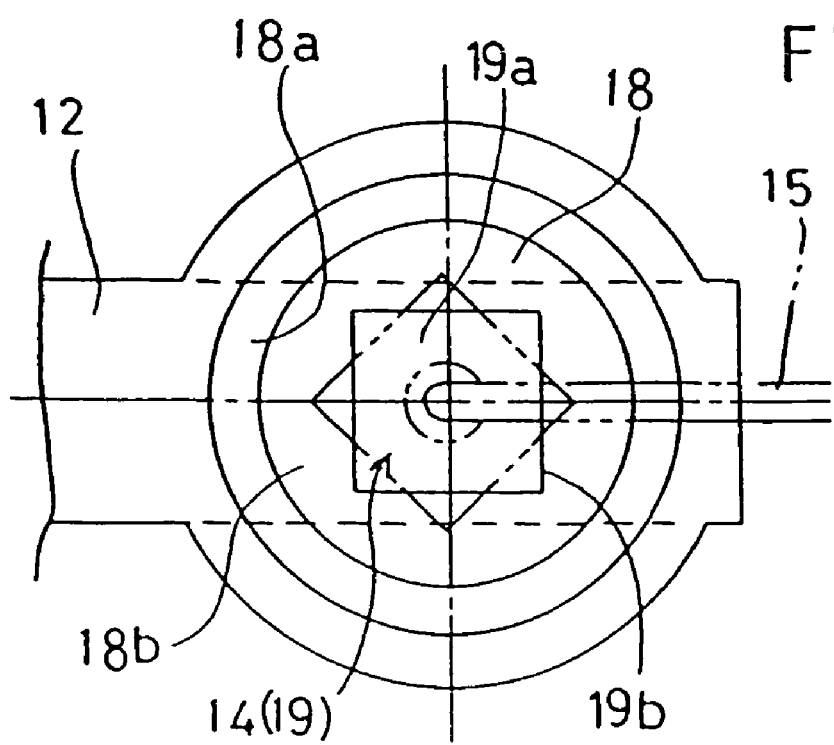
FIG. 11 is a plan view of FIG. 10.

As indicated by double-dashed lines in FIG. 11 which illustrates the lamp as viewed in the direction of the axis 18c of the cup 18, when the rectangular LED chip 14 is placed on the solder paste applied to the protrusion 19, the sides of the LED chip 14 may not be in parallel with the sides of the protrusion 19 or the center of the LED chip 14 may be offset from the center of the protrusion 19. With the above arrangement, however, the surface tension of the molten solder acts simultaneously on each side of the LED chip 14 and each side of the protrusion 19. Therefore, as viewed in the direction of the axis 18c of the cup 18, the posture of the LED chip 14 is automatically corrected (which is referred to as "self alignment") so that each side of the LED chip 14 become parallel or generally parallel with a respective side of the protrusion 19. Further, the position of the LED chip 14 is automatically corrected (which is referred to as "self alignment") so that the center of the LED chip 14 corresponds to the center of the protrusion 19.

Through the experiment by the inventors, it has been found that the automatic correction (self alignment) of the posture and position of the LED chip due to the surface tension of the molten solder is reliably achieved when the length L2 and the width W2 of the rectangle at the top surface 19a of the protrusion 19 lie in the range of 0.5 to 1.5 times the length L0 and the width W0 of the rectangle of the LED chip 14 and is most reliably achieved when in the range of 0.75 to 1.25 times.

In the case where the protrusion 19 is circular as viewed in the direction of the axis 18c of the cup 18, the automatic correction (self alignment) for positioning the LED chip 14 at the center of the protrusion 19 can be achieved when the diameter of the protrusion 19 is set to lie in the range of 0.5 to 1.5 times, most preferably 0.75 to 1.25 times the length of one side of the LED chip 14.

However, for the self alignment, it is more preferable to make the configuration, in plan view, of the top surface 19a of the protrusion 19 congruent or similar to that of the bottom surface of the LED chip 14. For instance, when the configuration of the bottom surface of the LED chip 14 is rectangular, it is more preferable to make the top surface 19a of the protrusion 19 rectangular. Similarly, for a square, rhombic, triangular or circular bottom surface of the LED chip 14, it is preferable to make the protrusion 19 square, rhombic, triangular or circular for realizing a congruent or similar configuration.

Specifically, the self alignment can be achieved when the bottom surface of the LED chip 14 is congruent and equal in area to the top surface 19a of the protrusion 19, with the contour of the top surface 19a of the protrusion 19 corresponding to the contour of the bottom surface of the LED chip 14 as viewed in the direction of the axis 18c. Further, the self alignment can be achieved also when the bottom surface of the LED chip 14 is similar to and slightly larger in area than the top surface 19a of the protrusion 19, with the contour of the bottom surface of the LED chip 14 indicated by double-dashed lines and the reference sign 14' in FIGS. 12 and 13 located outward of the contour 19c of the top surface 19a of the protrusion 19. Further, the self alignment can be achieved also when the bottom surface of the LED chip 14 is similar to and slightly smaller in area than the top surface 19a of the protrusion 19, with the contour of the bottom surface of the LED chip 14 indicated by double-dashed lines and the reference sign 14" in FIGS. 12 and 13 located inward of the contour 19c of the top surface 19a of the protrusion 19.

As noted above, an excess of molten solder paste H which has not adhered to the top surface 19a of the protrusion 19 flows downward from the top surface 19a along an outer side surface 19b for accumulation on the bottom surface 18b located at a lower position. Therefore, unlike the prior art technique, the molten solder is unlikely to rise from the bottom surface onto a side surface of the LED chip 14 even when a large amount of solder paste H is applied.

Moreover, the thickness of the molten solder on the top surface 19a of the protrusion 19 can be reduced, and the variation of the thickness of the molten solder on the top surface 19a depending on the applied amount of solder can be suppressed. Therefore, as compared with the case where the protrusion 19 is not provided, it is possible to more reliably prevent the height of the LED chip 14 placed on the molten solder from varying in the direction of an axis 18c of the cup 18 due to the variation of the applied amount of solder paste H, i.e., the amount of molten solder. Moreover, the LED chip 14 is more reliably prevented from inclining relative to the axis 18c of the cup 18.

When the die bonding material is a thermally hardenable material such as silver paste or indium paste, the viscosity of the die bonding material is not reduced from the initial state (when applied to the top surface 19a of the protrusion 19). Preferably, in such a case, the area of the bottom surface of the LED chip 14 is made slightly larger than the area of the top surface 19a of the protrusion 19. With such a structure, when the LED chip 14 is placed on the silver paste or indium paste applied to the top surface 19a of the protrusion 19 and pushed toward the top surface 19a, an excess of the silver paste (or indium paste) is prevented from being pushed out sideways from under the bottom surface of the LED chip 14. Therefore, the paste is prevented from bulging to rise along a side surface of the LED chip. Therefore, even when the light emitting layer 14a of the LED chip 14 is provided at a height position closer to the bottom surface, it is possible to reliably prevent such a situation that the light emitted from the light emitting layer 14a is blocked by the die bonding material and hence inhibited from reaching the conical light reflective surface 18a of the cup 18.

Figure 12:
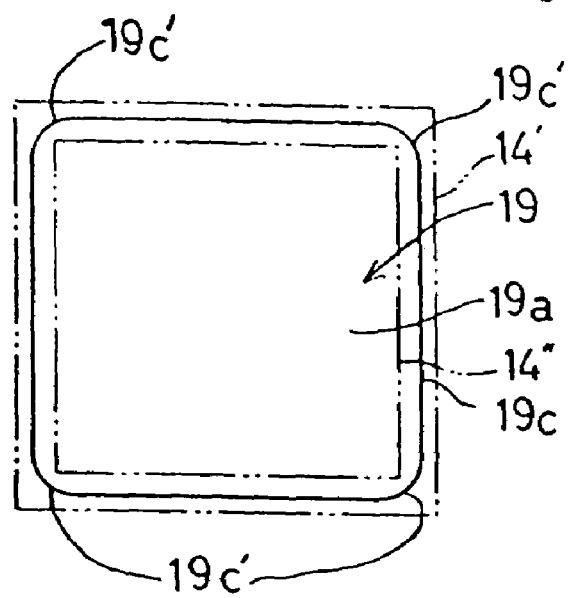
FIG. 12 is a plan view showing the size relationship between the top surface of the protrusion and the bottom surface of the LED chip when the top surface is rectangular as viewed in plan.
Figure 13:
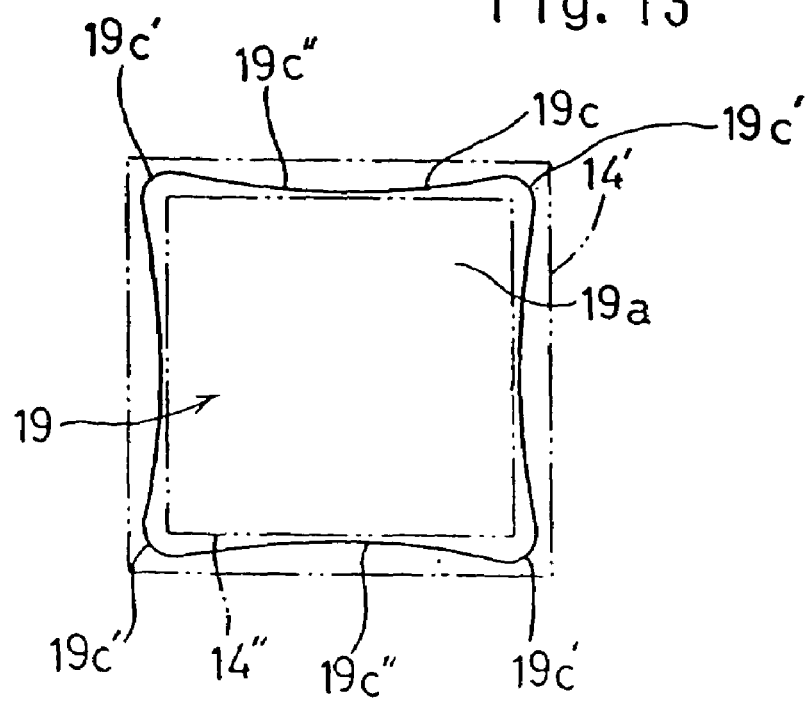
FIG. 13 is a plan view showing the size relationship between the top surface of the protrusion and the bottom surface of the LED chip when each side surface of the protrusion is curved.

In this case, each of the corners 19c' of the contour 19c of the top surface 19a of the protrusion 19 may be rounded, as shown in FIG. 12, or the line between adjacent corners 19c' of the contour 19c may be curved inwardly, as indicated by the reference sign 19c'' in FIG. 13. Such structures are effective in causing the die bonding material (regardless of thermally meltable or thermally hardenable) applied to the top surface 19a of the protrusion 19 to flow down toward the outer side surface 19b upon its melting or pushing of the LED chip 14, while realizing the self alignment.

Figure 14:
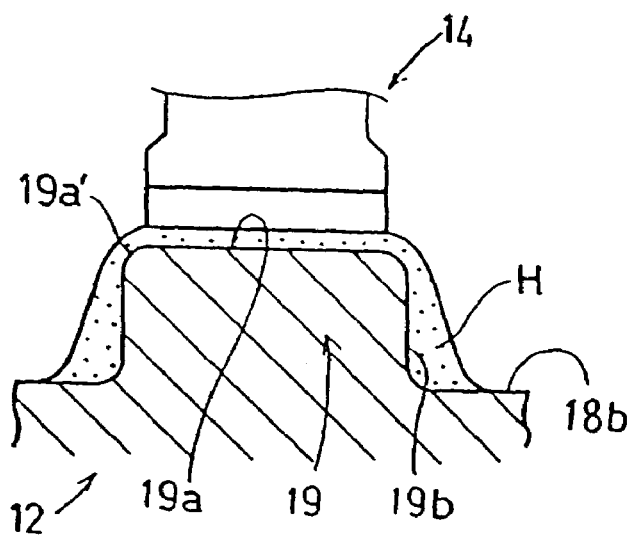
FIG. 14 shows a structure in which the portion where the top surface and the outer side surface of the protrusion meet is rounded.
Figure 15:
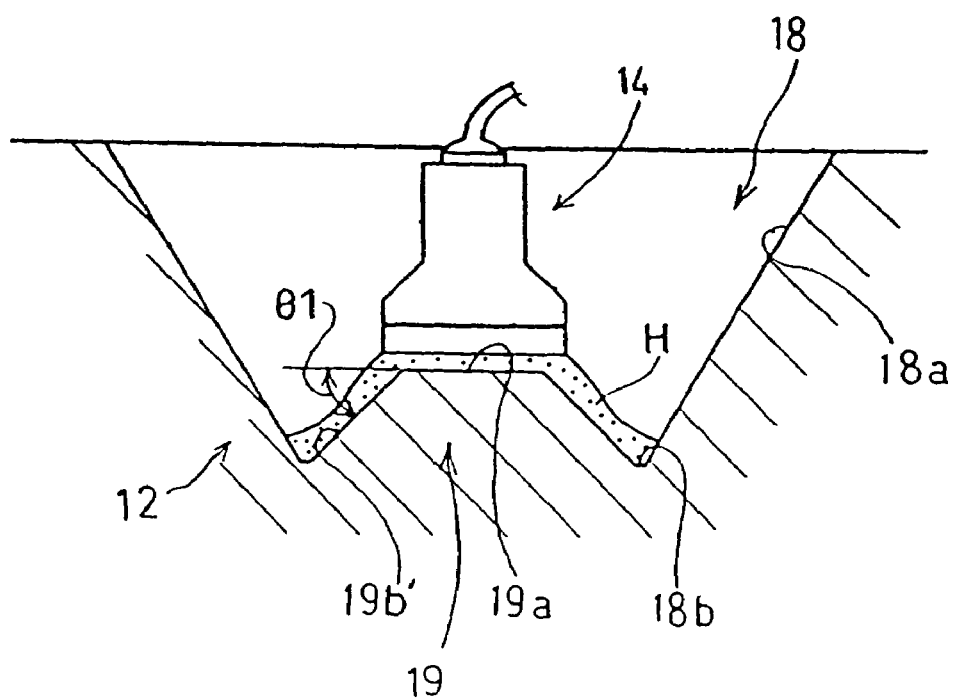
FIG. 15 shows a structure in which the outer side surface of the protrusion is inclined.
Figure 16:
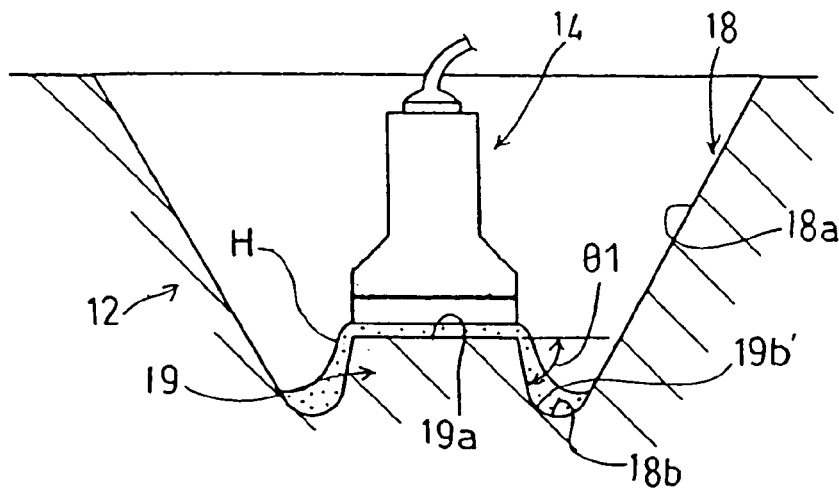
FIG. 16 shows a variation of the inclined outer side surface of the protrusion.

Further, as shown in FIG. 14 which is a longitudinal sectional view of the protrusion 19, the corner where the top surface 19a and the outer side surface 19b meet may also be rounded, as indicated by the reference sign 19a'.

With the provision of the rounded portion 19a', an excess of the die bonding material (regardless of thermally meltable or thermally hardenable) applied to the top surface 19a is more likely to flow down toward the outer side surface 19b of the protrusion 19 upon its melting or pushing of the LED chip 14. Particularly, when a thermally meltable die bonding material flows down from the top surface 19a toward the outer side surface 19b upon melting, the existence of the rounded portion 19a' prevents the layer of the die bonding material from breaking halfway, whereby the die bonding material flows while uniformly spreading radially outward (to all sides) of the top surface 19a. Therefore, the self alignment can be reliably achieved. Further, the film thickness of the die bonding material on the top surface 19a becomes uniform, whereby the axis of the LED chip 14 placed thereon does not incline largely relative to the top surface 19a.

As shown in FIGS. 15, 16, 17, 18, 19 and 20, the protrusion 19 may have an outer side surface 19b' which is inclined at an angle θ1 to the top surface 19a.

The inclination angle θ1 of the outer side surface 19b' may be set to about 20 to 80 degrees, for example.

Since the outer side surface 19b' is inclined at an angle θ1 smaller than 90 degrees (gentle inclination), an excess of the die bonding material (regardless of thermally meltable or thermally hardenable) of the solder past H applied to the top surface 19a is more likely to flow down toward the outer side surface 19b' of the protrusion 19 upon its melting or pushing of the LED chip 14. Particularly, since the layer of the die melted bonding material is prevented from breaking halfway, the die bonding material flows while uniformly spreading radially outward (to all sides) of the top surface 19a. Therefore, the self alignment can be reliably achieved. Further, the film thickness of the die bonding material on the top surface 19a becomes uniform, whereby the inclination of the axis of the LED chip 14 relative to the top surface 19a can be reliably suppressed.

When the inclination angle θ1 of the outer side surface 19b' is smaller than 20 degrees, the LED chip 14 placed on the top surface 19a is likely to slip toward the lower side of the inclined surface. When the inclination angle θ1 is larger than 80 degrees, the effect of the inclination is deteriorated. As a result of experiments, the inclination angle θ1 in the range of 35 to 60 degrees is found to be most effective.

Figure 17:
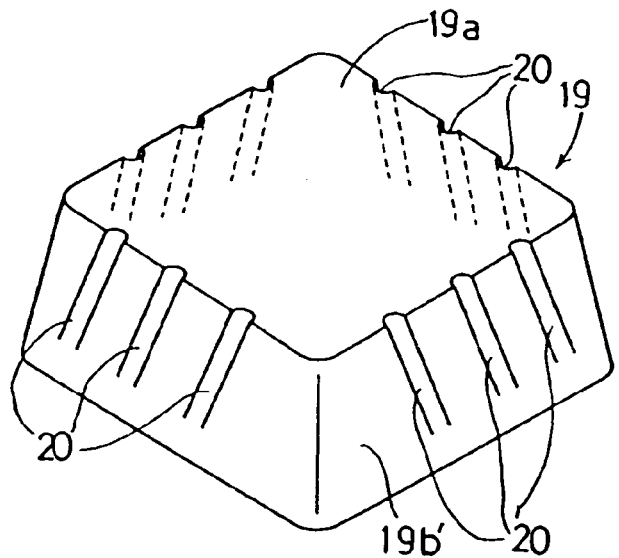
FIG. 17 is a perspective view showing a structure in which the outer side surface of the protrusion is formed with narrow grooves.
Figure 18:
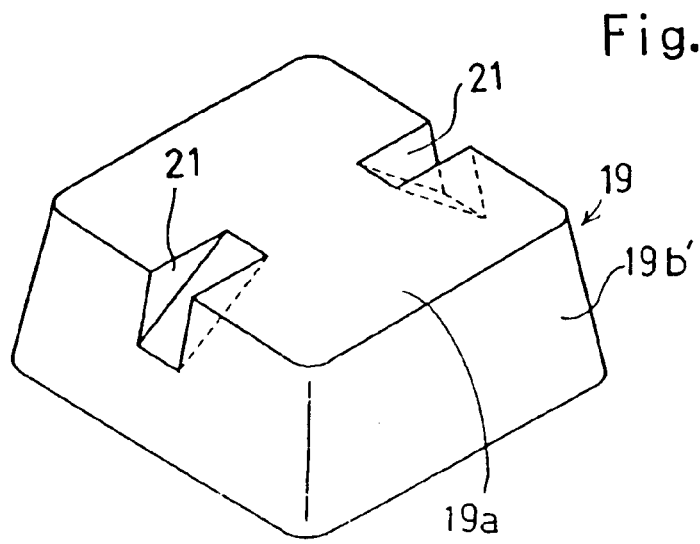
FIG. 18 is a perspective view showing a structure in which the outer side surface of the protrusion is formed with wide grooves.

As shown in FIG. 17, the outer side surface 19b or the inclined outer side surface 19b' of the protrusion 19 may be formed with a plurality of relatively narrow grooves 20 extending from the top surface 19a toward the base portion of the protrusion. Alternatively, as shown in FIG. 18, the outer side surface 19b or the inclined outer side surface 19b' of the protrusion 19 may be formed with an opposite pair of relatively wide grooves 21 extending from the top surface 19a toward the base portion, of the protrusion. With such structures, an excess of the die bonding material H (regardless of thermally meltable or thermally hardenable) applied to the top surface 19a is guided along the narrow grooves 20 or the wide grooves 21, i.e., passes through the narrow grooves 20 or the wide grooves 21 to readily flow toward the base portion of the protrusion 19.

To reliably guide the die bonding material, each of the wide grooves 21 has a depth which gradually increases as the groove extends from a portion closer to the base portion toward the top surface 19a.

Figure 19:
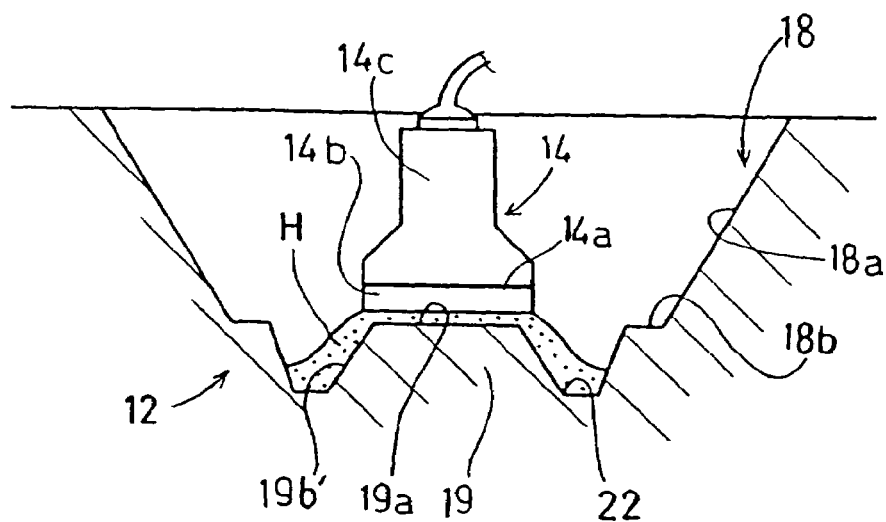
FIG. 19 shows a structure in which the base portion of the protrusion is formed with a deep annular groove.
Figure 20:
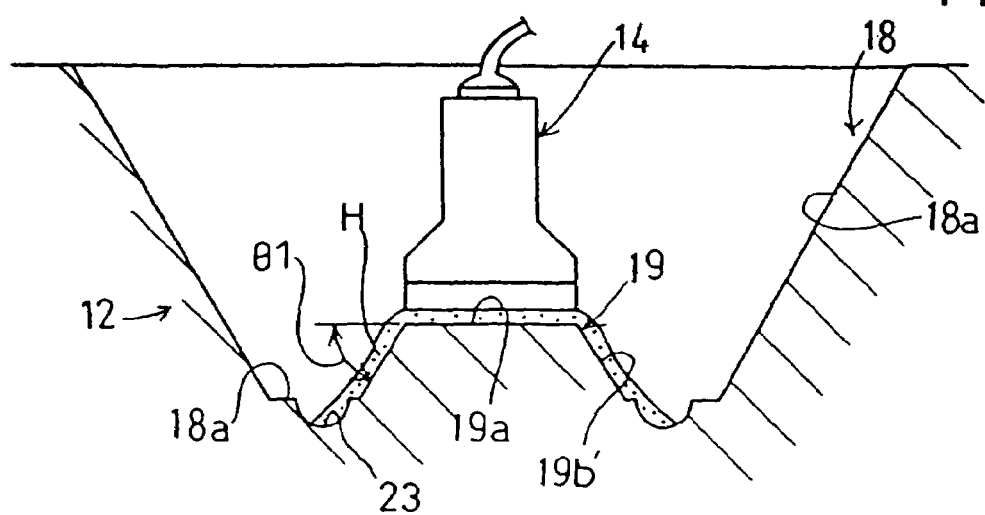
FIG. 20 shows a variation of the structure in which the base portion of the protrusion is formed with a deep annular groove.

As shown in FIGS. 19 and 20, the bottom surface 18b of the cup 18 may be formed with an annular groove 22 or 23 surrounding the outer periphery of the base portion of the protrusion 19.

With such a structure, even when an excessive amount of die bonding material H (regardless of thermally meltable or thermally hardenable) is applied to the top surface 19a, the excess of the die bonding material H can be reliably accumulated in the annular groove 22, 23 formed at the bottom surface 18b. Therefore, the self alignment can be achieved, and short circuiting and the inclination of the LED chip 14 placed on the top surface 19a can be prevented.

In the structure shown in FIG. 19, the top surface 19a of the protrusion 19 is made generally flush with the bottom surface 18b of the cup 18. With such a structure, the light emitting layer 14a of the LED chip 14 provided between a lower layer 14b and an upper layer 14c can be located at a relatively deep position in the cup 18 surrounded by the conical light reflective surface 18a. Therefore, the light emitted from the light emitting layer 14a can be directed to a deeper position on the conical light reflective surface 18a, whereby the light conversion efficiency can be enhanced.

The inclined outer side surface 19b' of the protrusion 19 may be made a rough surface such as a satin-finished surface. In this case, when an excess of solder paste H applied to the top surface 19a overflows onto the inclined outer side surface 19b', the solder paste H before heating stops on the rough, inclined peripheral surface 19b' provided by satin finishing, for example. When the solder paste H is heated thereafter, the solder melted on the rough, inclined side surface 19b' exhibits pump priming effect to promote the flow of the solder melted on the top surface 19a toward the base portion of the protrusion 19. Therefore, this arrangement can advantageously enhance the positioning accuracy of the LED chip 14 in the axial direction in addition to the above-noted advantages such as the achievement of the self alignment, the prevention of short circuiting and the prevention of inclination of the LED chip 14 placed on the top surface 19a.

Figure 21:
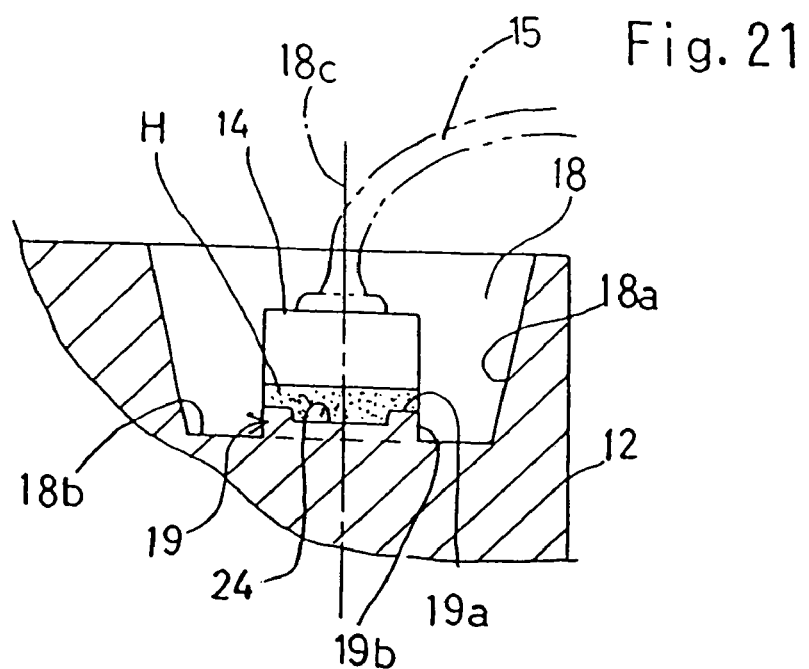
FIG. 21 is an enlarged longitudinal sectional view showing a variation of the second embodiment.
Figure 22:
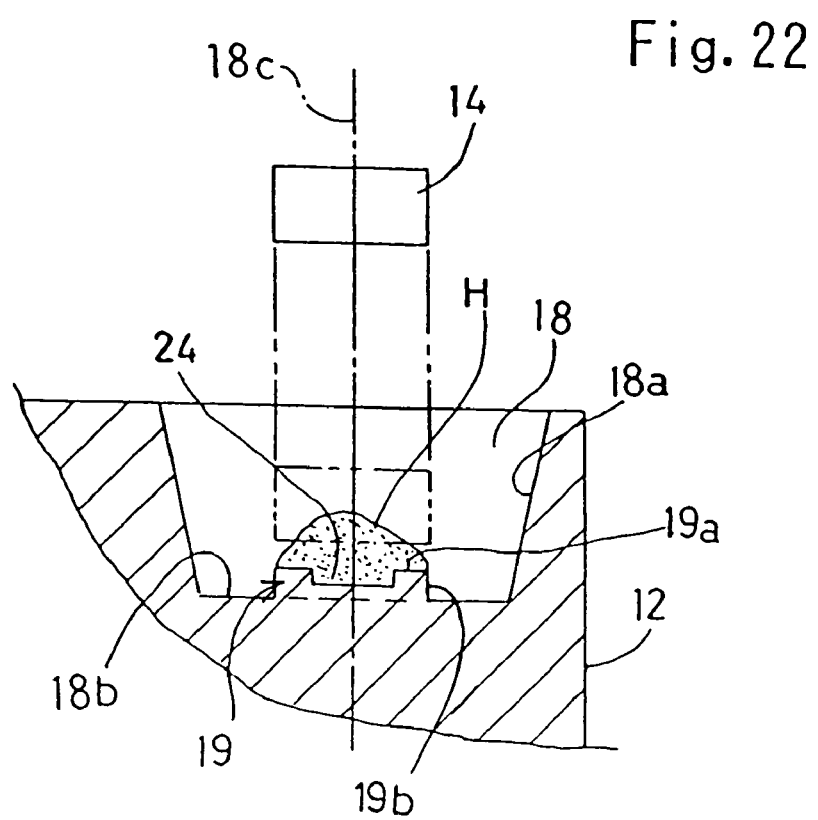
FIG. 22 is an enlarged longitudinal sectional view showing the die bonding of an LED chip in the variation shown in FIG. 21.

FIGS. 21 and 22 show a structure in which the protrusion 19 formed on the bottom surface 18b in the cup 18 in the lead terminal 12 has a top surface 19*a* formed with a recess 24 of a size which does not receive the LED chip 14.

With such an arrangement, a thick portion of the bulged molten solder partially enters the recess 24. Therefore, the thickness of the molten solder on the top surface 19*a* of the protrusion 19 at portions where the recess 24 does not exist can be made smaller than in the prior art technique, provided that the same amount of solder paste H is applied. Therefore, the variation of the thickness of the molten solder depending on the applied amount of solder can be suppressed. Therefore, as compared with the case where the recess 24 is not provided, the height variation of the LED chip 14 in the direction of an axis 18*c* of the cup 18 as a result of the variation of the applied amount of solder paste H, i.e., the amount of molten solder can be reliably suppressed. Moreover, the LED chip 14 is more reliably prevented from inclining relative to the axis 18*c* of the cup 8, and the molten solder is less likely to rise along a side surface of the LED chip 14.

Particularly, when a lens portion 17 is integrally formed at the front end of a molded portion 16 made of a transparent synthetic resin, the provision of the protrusion 19 and the provision of the recess 24 at the protrusion 19 makes it possible to accurately position the LED chip 14 at the focal point of the lens portion 17 or the nearby portion.

It is to be noted that the above noted arrangement such as the employment of the inclined outer side surface 19*b*', the provision of the narrow grooves 20 or wide grooves 21, and the employment of the top surface 19*a*' congruent or similar to the LED chip 14 is also applicable to the structure shown in FIGS. 21 and 22.

Figure 23:
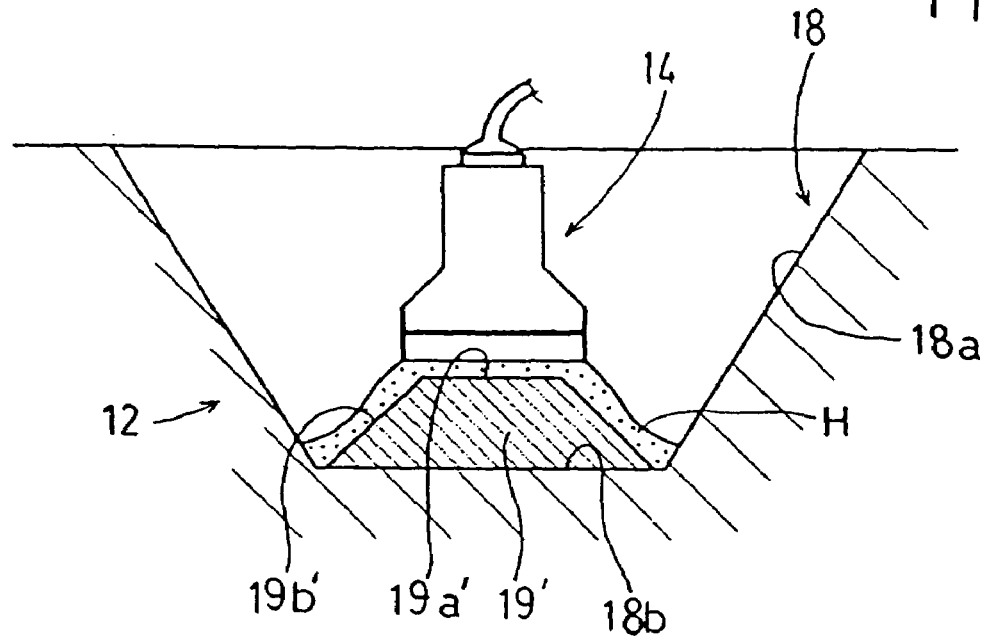
FIG. 23 is an enlarged longitudinal sectional view showing a variation of light emitting diode lamp according to the second embodiment.
Figure 24:
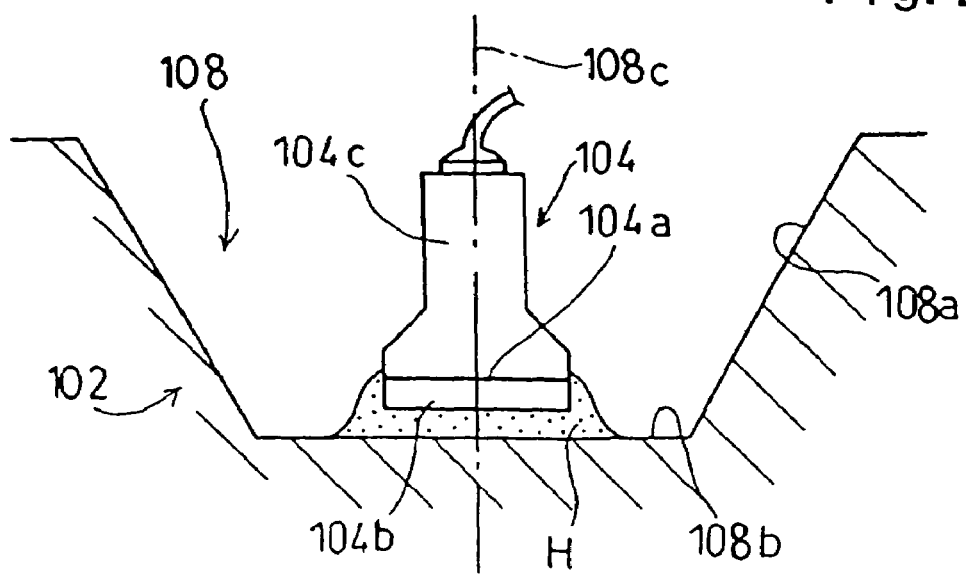
FIG. 24 is an enlarged view showing a principal portion of a prior art light emitting diode lamp.
Figure 25:
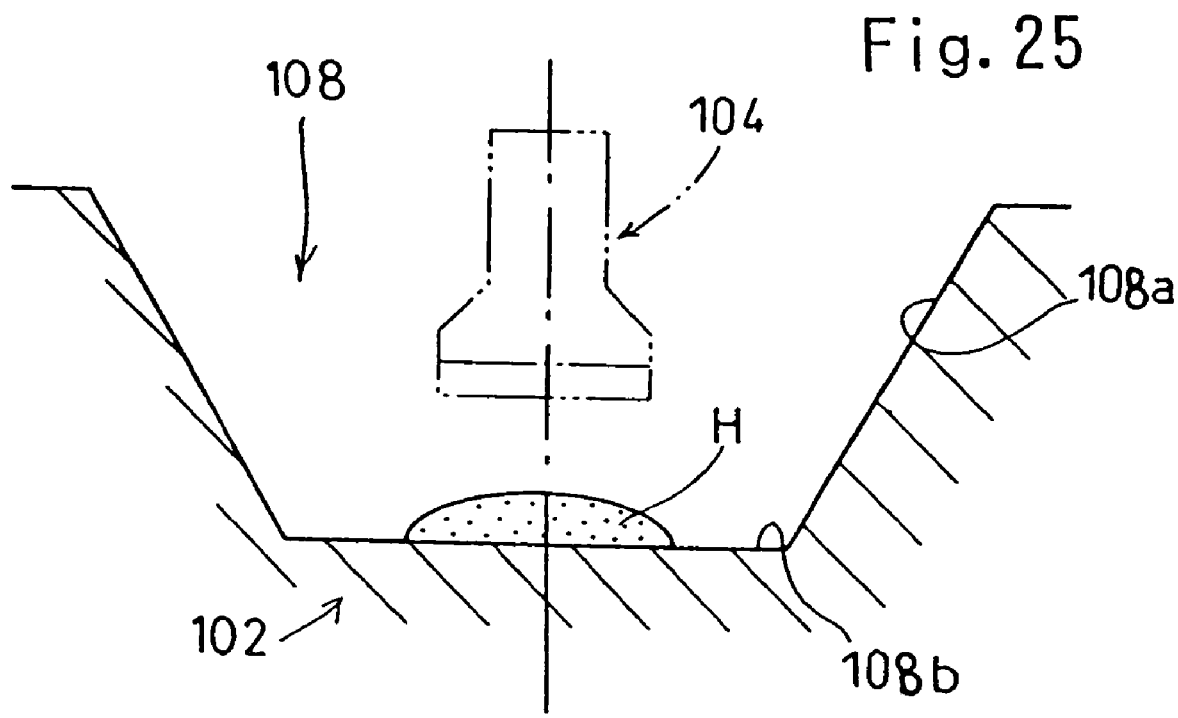
FIG. 25 shows the die bonding of an LED chip in the prior art light emitting diode lamp.

FIG. 23 shows a structure in which a protrusion 19' in the form of a block formed separately from the lead terminal 12 is fixed to the bottom surface 18*b* of a cup 18 formed in the lead terminal 12. The block-like protrusion 19' has a top surface 19*a*' on which an LED chip 14 is bonded using a thermally meltable or thermally hardenable die bonding material H in a manner similar to the above.

With such an arrangement, the protrusion 19' can be made of a material which is different from that of the lead terminal 12.

It is to be noted that the above noted arrangement such as the employment of the inclined outer side surface 19*b*', the provision of the narrow grooves 20 or wide grooves 21, and the employment of the top surface 19*a*' congruent or similar to the LED chip 14 is also applicable to the block-like protrusion 19' shown in FIG. 23.

In the present invention, the thermally meltable die bonding material is not limited to the solder paste noted above, and other thermally meltable die bonding material may be used.

The invention claimed is:

1. A light emitting diode lamp comprising: at least one lead terminal formed with a cup having a conical inner circumferential surface serving as a light reflective surface; an LED chip bonded to a bottom surface of the cup with a die bonding material; and a molded portion made of a transparent synthetic resin for packaging at least the cup of the lead terminal;

wherein the bottom surface of the cup in the lead terminal is formed with a recess of a size which does not receive the LED chip, wherein the die bonding material comprises a thermally hardenable material, and wherein the LED chip has a rectangular bottom surface while the recess has a rectangular configuration which is similar to that of the bottom surface of the LED chip, as viewed from above the cup.

2. The light emitting diode lamp according to claim 1, wherein the rectangle of the recess has a length and a width which are no less than 0.5 times a length and a width of the rectangle of the LED chip, respectively.

3. A light emitting diode lamp comprising: at least one lead terminal formed with a cup having a conical inner circumferential surface serving as a light reflective surface; an LED chip bonded to a bottom surface of the cup with a die bonding material; and a molded portion made of a transparent synthetic resin for packaging at least the cup of the lead terminal;

wherein the bottom surface of the cup in the lead terminal is formed with a protrusion projecting like an island from the bottom surface, the protrusion having a top surface to which the LED chip is bonded, and wherein the protrusion bas an outer side surface inclined to flare toward a base portion of the protrusion;

wherein the die bonding material comprises a thermally meltable material, and wherein the outer side surface of the protrusion is a rough surface such as a satin-finished surface.

4. The light emitting diode lamp according to claim 3, wherein the top surface of the protrusion is formed with a recess of a size which does not receive the LED chip.

5. The light emitting diode lamp according to claim 3 or 4, wherein the bottom surface of the cup is formed with an annular groove surrounding the protrusion, the top surface of the protrusion being generally flush with the bottom surface of the cup.

6. The light emitting diode lamp according to claim 3 or 4, wherein the bottom surface of the cup is formed with an annular groove surrounding the base portion of the protrusion.

7. The light emitting diode lamp according to claim 3 or 4, wherein a portion where the top surface of the protrusion and the outer side surface of the protrusion meet is rounded.

8. The light emitting diode lamp according to claim 3 or 4, wherein the die bonding material comprises a thermally meltable material, and wherein the protrusion has a configuration which is congruent or similar to a configuration of a bottom surface of the LED chip, as viewed from above the cup.

9. The light emitting diode lamp according to claim 3 or 4, wherein the die bonding material comprises a thermally meltable material, and wherein, as viewed from above the cup, the top surface of the protrusion has a configuration which is congruent or similar to a configuration of a bottom surface of the LED chip and has an area which is slightly smaller or larger than an area of the bottom surface of the LED chip.

10. A light emitting diode lamp comprising: at least one lead terminal formed with a cup having a conical inner circumferential surface serving as a light reflective surface; an LED chip bonded to a bottom surface of the cup with a die bonding material; and a molded portion made of a transparent synthetic resin for packaging at least the cup of the lead terminal;

wherein the bottom surface of the cup in the lead terminal is formed with a protrusion projecting like an island from the bottom surface, the protrusion having a top surface to which the LED chip is bonded, and wherein the protrusion has an outer side surface inclined to flare toward a base portion of the protrusion; and wherein the protrusion comprises a block-like member formed separately from the lead terminal and fixed to the bottom surface of the cup.

11. A light emitting diode lamp comprising: at least one lead terminal formed with a cup having a conical inner circumferential surface serving as a light reflective surface; an LED chip bonded to a bottom surface of the cup with a die bonding material; and a molded portion made of a transparent synthetic resin for packaging at least the cup of the lead terminal;

wherein the bottom surface of the cup in the lead terminal is formed with a protrusion projecting like an island from the bottom surface, the protrusion having a top surface to which the LED chip is bonded, and wherein the protrusion has an outer side surface inclined to flare toward a base portion of the protrusion; and wherein the outer side surface of the protrusion is formed with a groove elongated in a height direction of the protrusion far guiding the die bonding material from the top surface of the protrusion toward the base portion.

12. A light emitting diode lamp comprising: at least one lead terminal formed with a cup having a conical inner circumferential surface serving as a light reflective surface; an LED chip bonded to a bottom surface of the cup with a die bonding material; and a molded portion made of a transparent synthetic resin far packaging at least the cup of the lead terminal;

wherein the bottom surface of the cup in the lead terminal is formed with a protrusion projecting like an island from the bottom surface, the protrusion having a top surface to which the LED chip is bonded; and wherein the protrusion is rectangular as viewed from above the cup and includes four side surfaces and four corners, each side surface being concave toward a center of the protrusion between two adjacent corners.

\* \* \* \* \*